United States Patent [19]
Maeda et al.

[11] Patent Number: 5,399,894
[45] Date of Patent: Mar. 21, 1995

[54] SEMICONDUCTOR DEVICE HAVING BIPOLAR TRANSISTOR AND MOS TRANSISTOR

[75] Inventors: Takeo Maeda; Hiroshi Momose, both of Tokyo; Yukihiro Urakawa, Kawasaki; Masataka Matsui, Tokyo, all of Japan

[73] Assignee: Kabushiki Kaisha Toshiba, Kawasaki, Japan

[21] Appl. No.: 23,153

[22] Filed: Oct. 28, 1992

Related U.S. Application Data

[63] Continuation of Ser. No. 710,341, Jun. 5, 1991, abandoned.

[30] Foreign Application Priority Data

Jun. 6, 1990 [JP] Japan .................................. 2-146316

[51] Int. Cl.⁶ ..................... H01L 27/02; H01L 29/161
[52] U.S. Cl. ...................................... 257/370; 257/52; 257/197; 257/65; 257/616
[58] Field of Search ...................... 357/43, 16, 34, 61; 257/197, 198, 370, 51, 52, 65, 577, 616

[56] References Cited

U.S. PATENT DOCUMENTS

| | | | |
|---|---|---|---|
| 4,437,171 | 3/1984 | Hudson et al. | 357/43 |
| 4,984,200 | 1/1991 | Saitoo et al. | 357/23.9 |
| 5,041,892 | 8/1991 | Yano et al. | 357/43 |
| 5,144,398 | 9/1992 | Morishita | 257/77 |
| 5,198,689 | 3/1993 | Fujioka | 257/197 |

OTHER PUBLICATIONS

E. J. Prinz et al., "The Effect Of Base–Emitter Spacers And Strain–Dependent Densities Of States In $Si_{1-x}Ge_x$/Si Heterojunction Bipolar Transistors" Digest Of International Electron–Device Meeting, p. 639 1989.

*Primary Examiner*—Mark V. Prenty
*Attorney, Agent, or Firm*—Finnegan, Henderson, Farabow, Garrett & Dunner

[57] ABSTRACT

A semiconductor device of the present invention includes a bipolar transistor and MOS transistors which are formed on the same semiconductor substrate. The bipolar transistor is heterojunction transistor having a hetero junction. The hetero-bipolar transistor is a bipolar transistor of double-hetero structure in which a material used for forming the base region thereof has a band gap narrower than a material used for forming the emitter and collector regions thereof.

14 Claims, 10 Drawing Sheets

SEMICONDUCTOR DEVICE HAVING BIPOLAR TRANSISTOR AND MOS TRANSISTOR

This application is a continuation of application Ser. No. 07/710,341, filed Jun. 5, 1991 and, now abandoned.

BACKGROUND OF THE INVENTION

1. Field of the Invention

This invention relates to the improvement of a semiconductor device having bipolar transistors and MOS transistors formed therein.

2. Description of the Related Art

In recent years, the technique of miniaturizing MOS transistors in the field of integrated circuit technology using silicon has been further enhanced, and as a result, attempts have been made to lower the power source voltage $V_{dd}$ to attain high reliability and low power consumption of the MOS transistors.

However, with an integrated circuit such as a totem-pole type BiCMOS gate having bipolar transistors and MOS transistors, high-speed operation of the BiCMOS gate is deteriorated when the power source voltage $V_{dd}$ is lowered. The reason for this is that the built-in potential (voltage between the base and the emitter) $V_{bi}$ of the bipolar transistor is always kept physically constant and therefore the ratio ($V_{bi}/V_{dd}$) of the built-in potential $V_{bi}$ to the power source voltage $v_{dd}$ will become large.

SUMMARY OF THE INVENTION

The present invention has been made to solve the above problems, and an object of this invention is to provide a semiconductor device in which the operation speed of a BiCMOS gate can be prevented from being lowered when The power source voltage is lowered.

In order to attain the above object, the semiconductor device of the present invention comprises bipolar transistors and MOS transistors which are formed in the same substrate, the bipolar transistor being a hetero-bipolar transistor having a heterojunction.

The hetero-bipolar transistor has a double hereto structure and the material used for forming the base region thereof has a band gap narrower than that of the material used for forming the emitter region and collector region thereof.

Additional objects and advantages of the present invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

There will now be described an embodiment of the present invention with reference to the accompanying drawings.

Figure 1:
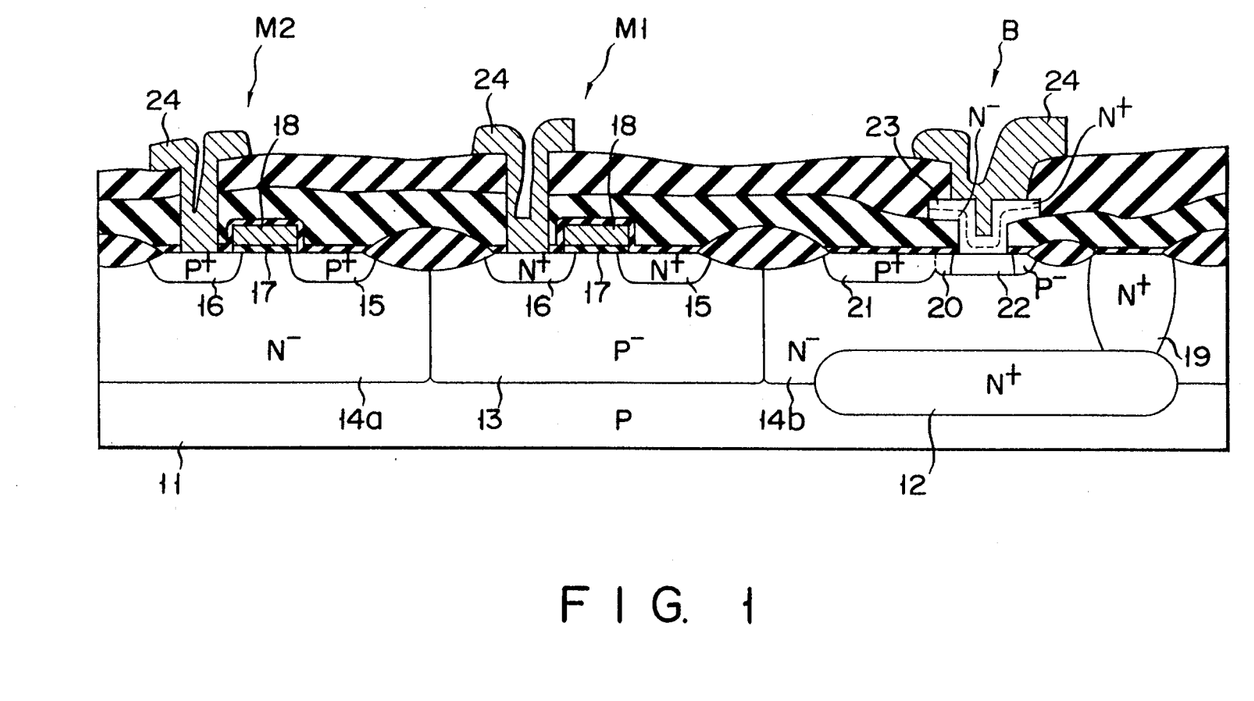
FIG. 1 is a cross sectional view showing a semiconductor device according to one embodiment of the present invention.

FIG. 1 shows a semiconductor device according to one embodiment of this invention. A bipolar transistor B, and MOS transistors $M_1$ and $M_2$ are formed on a P-type substrate 11. That is, an $N^+$-type buried region 12, a $P^-$-type well region 13 and $N^-$-type well regions 14a and 14b are formed on the P-type substrate 11. A source region 15 and a drain region 16 are formed in each of the $P^-$-type well region 13 and $N^-$-type well region 14a. A gate insulation film 17 is formed on a channel region between the source region 15 and the drain region 16. A gate electrode 18 is formed on the gate insulation film 17. An $N^+$-type region 19 connected to a collector electrode is formed in the $N^-$-type well region 14b. Further, an internal base region 20 and an external base region 21 are formed in the surface area of the $N^-$-type well region 14b. An SiGe layer (mixed crystal of silicon and germanium) 22 is formed in the internal base region 20. An emitter layer 23 formed of amorphous silicon is formed on the SiGe layer 22. The emitter region 23 is formed of $N^-$-type and $N^+$-type layers. Further, Al wiring layers 24 are connected to the drain regions 16 of the MOS transistors $M_1$ and $M_2$ and the emitter region 23 of the bipolar transistor B.

A feature of the present invention is that the bipolar transistor B is constructed by a hetero-bipolar transistor (which is hereinafter referred to as an HBT) having a heterojunction. Since the HBT has a small built-in potential (voltage between the base and emitter) $V_{bi}$, $V_{bi}/V_{dd}$ will not increase, unlike the conventional bipolar transistor having a homo junction, when the power source voltage $V_{dd}$ is lowered. Therefore, it becomes possible to operate an integrated circuit such as a BiCMOS circuit having bipolar transistors and MOS transistors formed therein at a low power source voltage. In this case, the material used for forming the base region of the HBT has a band gap narrower than the material used for forming the emitter and collector thereof. For example, the base region of the HBT can be formed of mixed crystal of silicon and germanium.

Figure 2:
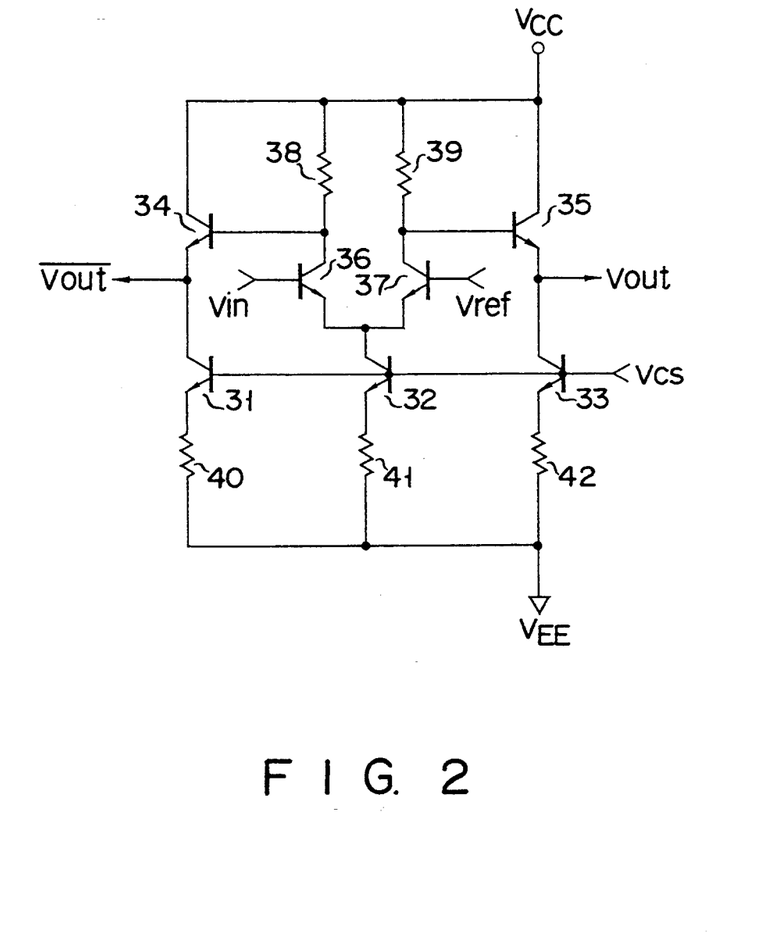
FIGS. 2 and 3 are circuit diagrams showing circuits using a semiconductor device of the present invention.

FIG. 2 shows an ECL logic circuit formed in the BiCMOS device. In FIG. 2, reference numerals 31 to 37 denote HBTs, reference numerals 38 to 42 denote resistors, $V_{ref}$ denotes a reference voltage, $V_{in}$ denotes an input voltage, and $V_{out}$ and $\overline{V}_{out}$ denote output voltages.

In general, the logical amplitude of a bipolar transistor is set substantially equal to the voltage (forward voltage of a diode) Vbetween the base and emitter thereof. Therefore, if a negative power source voltage $V_{EE}$ is considered to be the ground level, a positive power source voltage $V_{CC}$ must satisfy the condition defined by the following expression (1).

$$V_{CC} \geq 2V_f + V_{CS} \qquad (1)$$

(where $V_{CS}$ is a voltage applied to the bases of the bipolar transistors 31 to 33).

Therefore, assuming that the voltage between the base and emitter of the HBT is $V_f(\text{hetero})$ and the voltage between the base and emitter of the conventional homobipolar transistor is $v_f(\text{homo})$, then the power source voltage can be lowered by an amount expressed by the following equation.

$$V_{CC}(\text{homo}) - V_{CC}(\text{hetero}) =$$
$$(2V_f(\text{homo}) + V_{CS}) - (2V_f(\text{hetero}) + V_{CS}) =$$
$$2(V_f(\text{homo}) - V_f(\text{hetero})) = 2\Delta V_f$$

Figure 3:
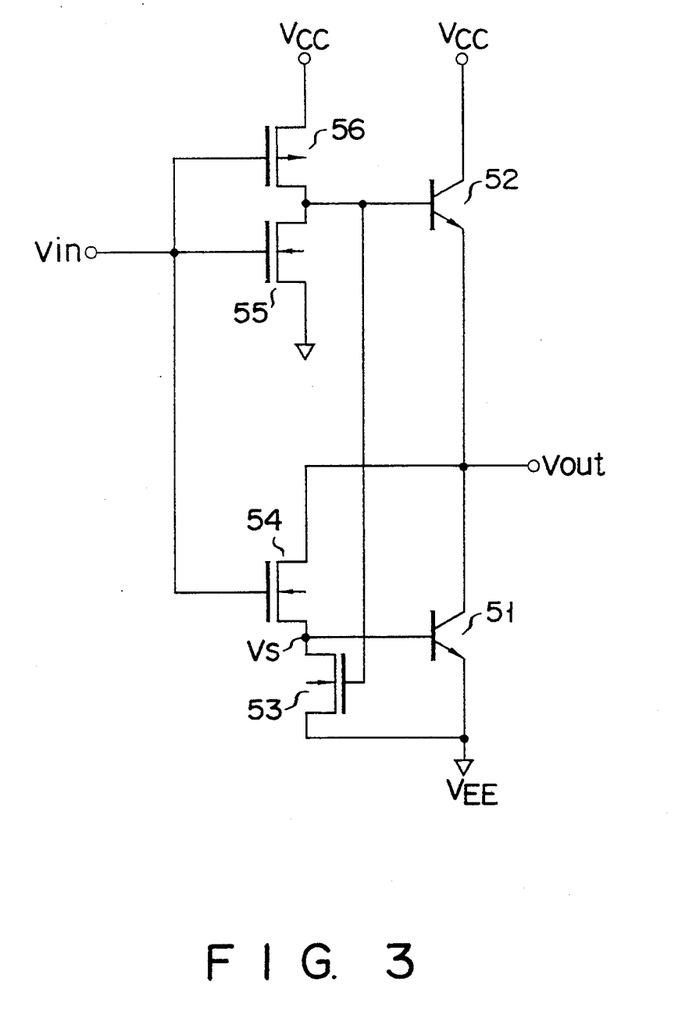

FIG. 3 shows a totem-pole type BiCMOS composite gate. In FIG. 3, reference numerals 51 and 52 denote HBTs, reference numeral 53 to 56 denote MOSFETs, $V_{in}$ denotes an input voltage, and $V_{out}$ denotes an output voltage.

In the circuit shown in FIG. 3, if a negative power source voltage $V_{EE}$ is set to be the ground level, the power source voltage $V_{CC}$ must satisfy the condition defined by the expression (2).

$$V_{CC} \geq 2V_f \qquad (2)$$

Therefore, assuming that the voltage between the base 10 and emitter of the HBT is $V_f(\text{hetero})$ and the voltage between the base and emitter of the conventional homobipolar transistor is $V_f(\text{homo})$, then the power source voltage can be lowered by an amount expressed by the following equation.

$$V_{CC}(\text{homo}) - V_{CC}(\text{hetero}) = 2(V_f(\text{homo}) - V_f(\text{hetero})) = 2\Delta V_f$$

Therefore, the power source voltage $V_{CC}$ used in a BiCMOS circuit, for example, can be set to a voltage level equal to or less than 3.6 V, for example, to 3.3 V.

Further, in the circuit of FIG. 3, the delay time of the BiCMOS composite gate is expressed by the sum of time $t_1$ to the turn-on of the MOS transistor and time $t_2$ from the time of turn-on of the bipolar transistor to the time of change of an output potential. That is, if the HBT, having a small built-in potential $V_{bi}$, is used, the time $t_2$ itself can be shortened and the following effect can be additionally attained. That is, since the source potential $V_S$ of the N-channel MOSFET 53 is lowered by approx. $\Delta V_f$ in comparison with a case wherein the homo-bipolar transistor is used, reduction in the driving ability of the N-channel MOSFET 54 due to the back-gate bias effect can be suppressed. As a result, the time $t_1$ becomes shorter, thereby greatly reducing the gate delay time of the BiCMOS composite gate.

Further, various effects such as an increase in the current amplification factor inherent to the HBT and reduction in the gate delay time due to reduction in the base resistance can be achieved by using the HBT. Further, the operation temperature can be kept low in comparison with a case wherein the homo-bipolar transistor is used.

Next, a method for manufacturing a semiconductor device of the present invention is explained in detail.

Figure 4A:
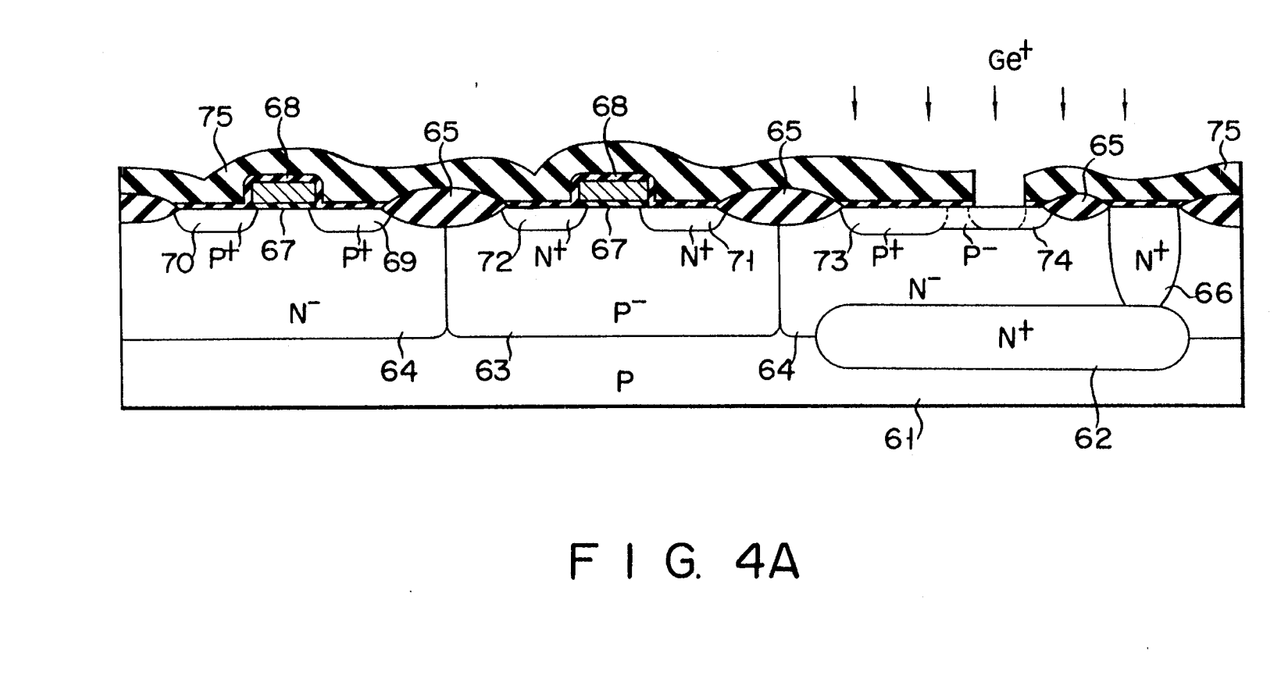
FIGS. 4A and 4B are cross sectional views showing a method of manufacturing a semiconductor device of the present invention.
Figure 4B:
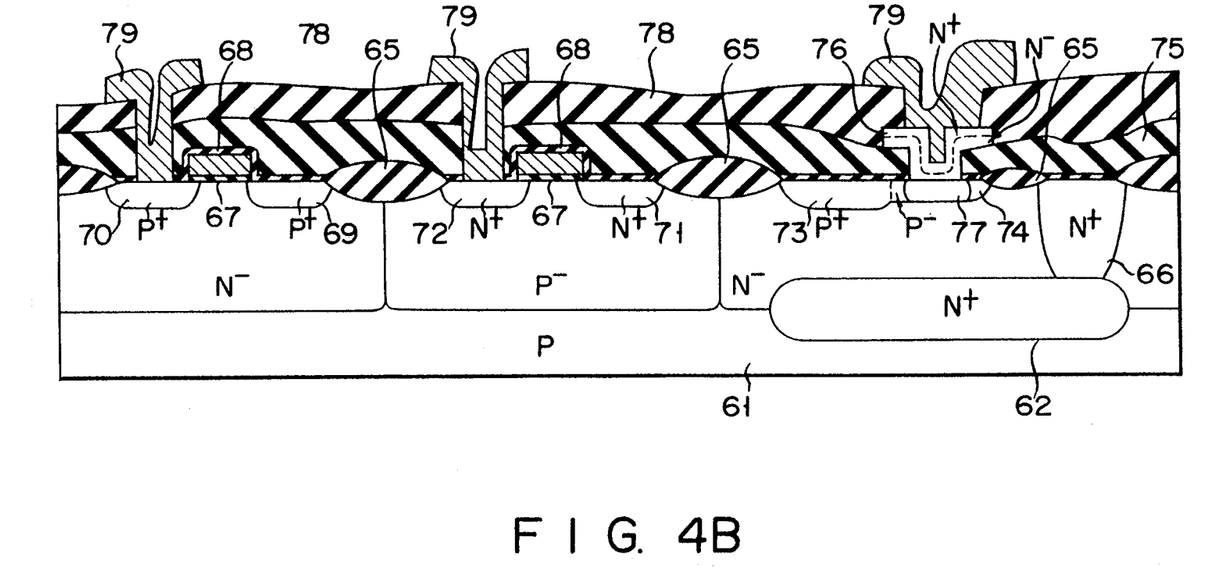

FIGS. 4A and 4B show a method of manufacturing a semiconductor device according to a first embodiment of the present invention.

First, as shown in FIG. 4A, an N+-type buried layer 62 is formed on a P-type substrate 61 and then an N-type epitaxial layer is formed on the entire surface of the structure. Further, P−-type wells 63 and N−-type wells 64 are formed in the N-type epitaxial layer. A field oxide film 65 is formed in the surface area of the N-type epitaxial layer. At this time, a trench may be formed in the N-type epitaxial layer to isolate bipolar transistors. Further, in a bipolar transistor forming area, an N+-type region 66 connected to a collector electrode is formed. Next, in a MOSFET forming area, channel ions are implanted to form gate oxide films 67. Further, after a polysilicon film is deposited on the entire surface of the structure, for example, the polysilicon film is patterned to form gate electrodes 68. Then, a heat treatment is effected to form a thermal oxide film on the entire surface of the structure. After this, in a P-channel MOSFET forming area, a P+-type impurity is ion-implanted to form a P+-type source region 69 and a P+-type drain region 70. At the same time, an external base region 73 is formed in the bipolar transistor forming area. The ion-implantation process is effected by ion-implanting boron fluoride (BF$_2$) at approx. 40 keV by an amount of approx. 2 to 5×10$^{15}$ cm$^{-3}$. Next, in an N-channel MOSFET forming area, an N+-type impurity is ion-implanted to form an N+-type source region 71 and an N+-type drain region 72. In this case, the ion-implantation process is effected by ion-implanting arsenic (As) at approx. 40 keV by an amount of approx. 2 to 5×10$^{15}$ cm$^{-3}$. Next, in the bipolar transistor forming area, a P−-type impurity is ion-implanted to form an internal base region 74. The ion-implantation process is effected by ion-implanting boron fluoride (BF$_2$) at approx. 20 to 80 keV by an amount of approx. 3 to 10×10$^{13}$ cm$^{-3}$. After this, an inter-level insulation film 75 is formed on the entire surface of the structure by the CVD method. Further, an opening is formed in the inter-level insulation film 75 in order to form an emitter region in the bipolar transistor forming area. Then, germanium (Ge+) is ion-implanted via the opening. The germanium is implanted at approx. 40 keV by an amount of approx. 5 to 20×10cm$^{-3}$.

Next, as shown in FIG. 4B, an amorphous silicon layer 76 is deposited to a thickness of 1000 to 4000 Å on the entire surface by use of the CVD method. The amorphous silicon layer 76 is used to form the emitter region of the bipolar transistor. After this, a mixed crystal of silicon and germanium is formed and then a heat treatment (at 600° to 900° C.) is effected in order to crystallize the silicon. As a result, an SiGe layer (mixed crystal of silicon and germanium) 77 is formed in the internal base region 74. Further, the amorphous silicon layer 76 is grown by the solid-phase epitaxial growth during the above heat treatment. The amorphous silicon layer 76 may have an N-type impurity of low impurity concentration doped therein. Further, the heat treatment for crystallizing silicon may be separately effected immediately after germanium is ion-implanted. Then, the amorphous silicon layer 76 is patterned to form the emitter region. For example, arsenic is ion-implanted at a high impurity concentration into the surface area of the emitter region to form an N+-type region. After an inter-level insulation film 78 is formed on the entire surface by use of the CVD method, a heat treatment is effected at 1000° C. for approx. 10 seconds. Contact holes reaching the emitter region and the like are formed in the inter-level insulation film 78. After this, an Al wiring layer 79 is formed and then a passivation film (not shown) is deposited on the entire surface.

With the above method, the MOSFETs and the HBT, having the mixed crystal of silicon and germanium formed in the base region, can be formed on the same substrate. Therefore, it becomes possible to use the HBT in the bipolar transistor of totem-pole type BICMOS composite gate as shown in FIG. 3. As a result, even if the power source voltage $V_{CC}$ is lowered, high-speed operation of the BiCMOS gate can be maintained.

Figure 5A:
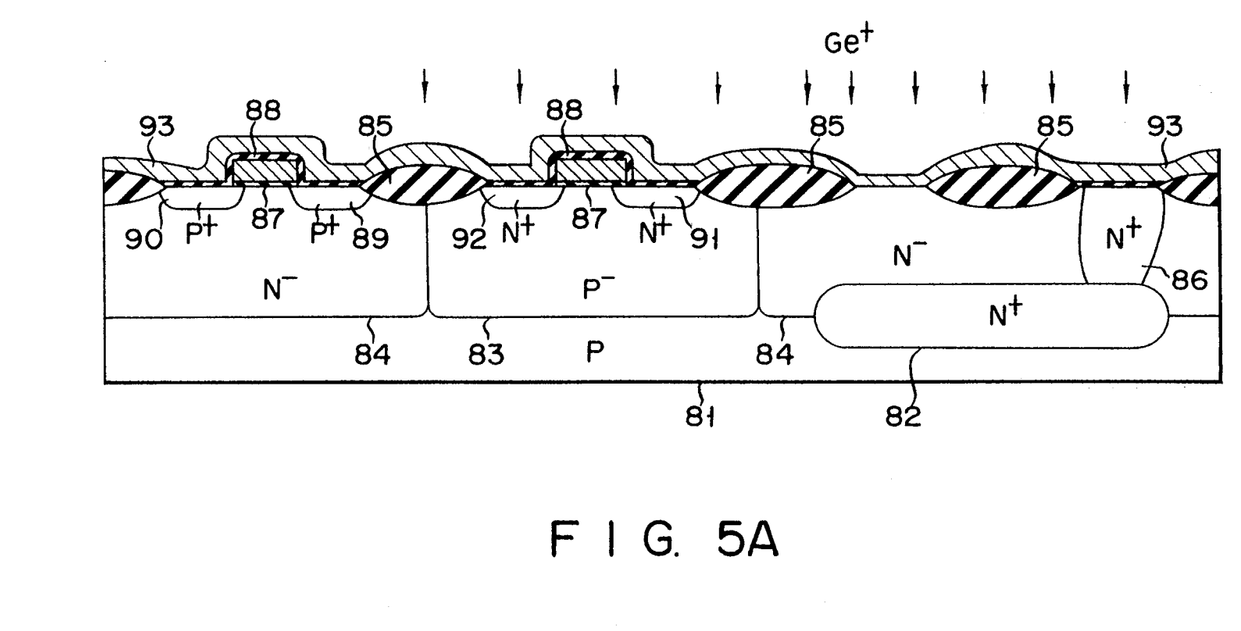
FIGS. 5A to 5C are cross sectional views showing a method of manufacturing a semiconductor device of the present invention.
Figure 5B:
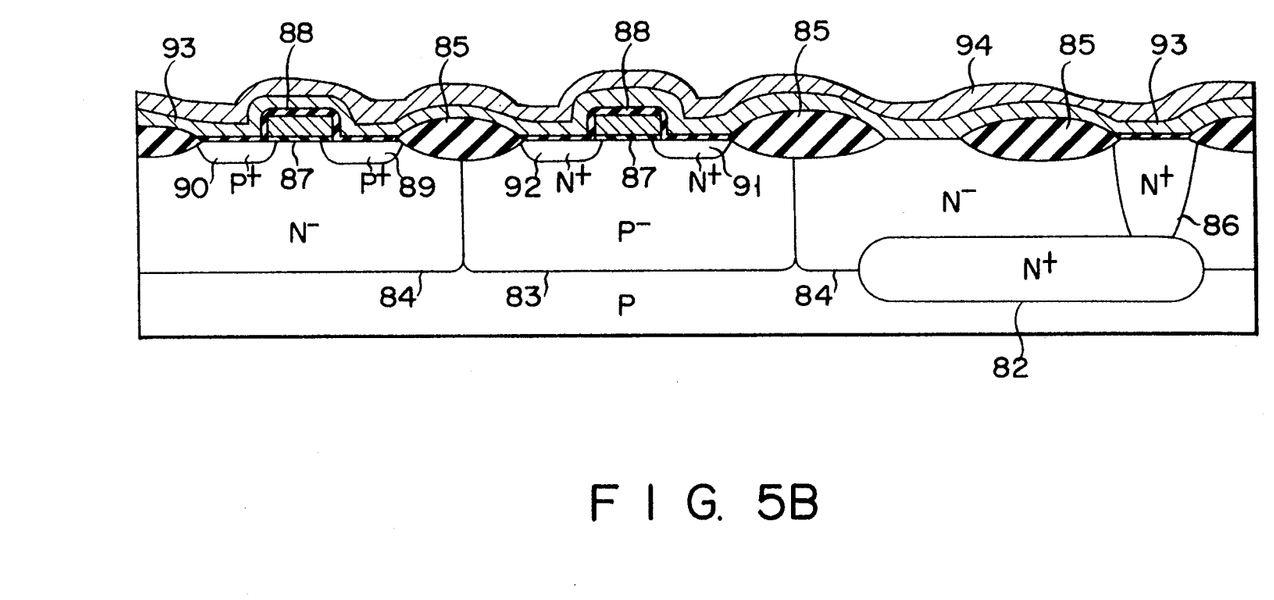

FIGS. 5A and 5B show a method of manufacturing a semiconductor device according to a second embodiment of the present invention.

First, as shown in FIG. 5A, an N+-type buried layer 82 is formed on a P-type substrate 81 and then an N-type epitaxial layer is formed on the entire surface of the structure. Further, P−-type wells 83 and N−-type wells 84 are formed in the N-type epitaxial layer. A field oxide film 85 is formed in the surface area of the N-type epitaxial layer. At this time, a trench may be formed in the N-type epitaxial layer to isolate bipolar transistors. Further, in a bipolar transistor forming area, an N+-type region 86 connected to a collector electrode is formed. Next, in a MOSFET forming area, channel ions are implanted to form gate oxide film 87. Further, after a polysilicon film is deposited on the entire surface of the structure, for example, the poly-silicon film is patterned to form gate electrodes 88. Then, a heat treatment is effected to form a thermal oxide film on the entire surface of the structure. After this, in a P-channel MOSFET forming area, a P+-type impurity is ion-implanted to form a P+-type source region 89 and a P+-type drain region 90. The ion-implantation process is effected by ion-implanting boron fluoride (BF$_2$) at approx. 40 keV by an amount of approx. 2 to $5 \times 10^{15}$ cm$^{-3}$. Next, in an N-channel MOSFET forming area, an N+-type impurity is ion-implanted to form an N+-type source region 91 and an N+-type drain region 92. In this case, the ion-implantation process is effected by ion-implanting arsenic (As) at approx. 40 keV by an amount of approx. 2 to $5 \times 10^{15}$ cm$^{-3}$. Next, a photo-lithographic process is effected to etch away the oxide film lying on the active region of the bipolar transistor. After this, an amorphous silicon layer 93 having a P−-type impurity doped therein by an amount of approx. 5 to $50 \times 10^{18}$ cm$^{-3}$ is formed to a thickness of 200 to 1000 Å on the entire structure. The amorphous silicon layer 93 is used as the base region of the bipolar transistor. Then, germanium (Ge+) is ion-implanted into the amorphous silicon layer 93 at approx. 40 KeV by an amount of approx. 5 to $20 \times 10^{16}$ cm$^{-3}$. The amorphous silicon layer 93 may be formed after the inter-level insulation film is formed by the CVD method. Further, an impurity is ion-implanted into the amorphous silicon layer 93 at a high impurity concentration to form an external base region.

Next, as shown in FIG. 5B, an amorphous silicon layer 94 is deposited to a thickness of 1000 to 4000 Å on the amorphous silicon layer 93 by use of the CVD method. The amorphous silicon layer 94 is used as the emitter region of the bipolar transistor. The amorphous silicon layer 94 may have an N-type impurity of low impurity concentration doped therein.

Figure 5C:
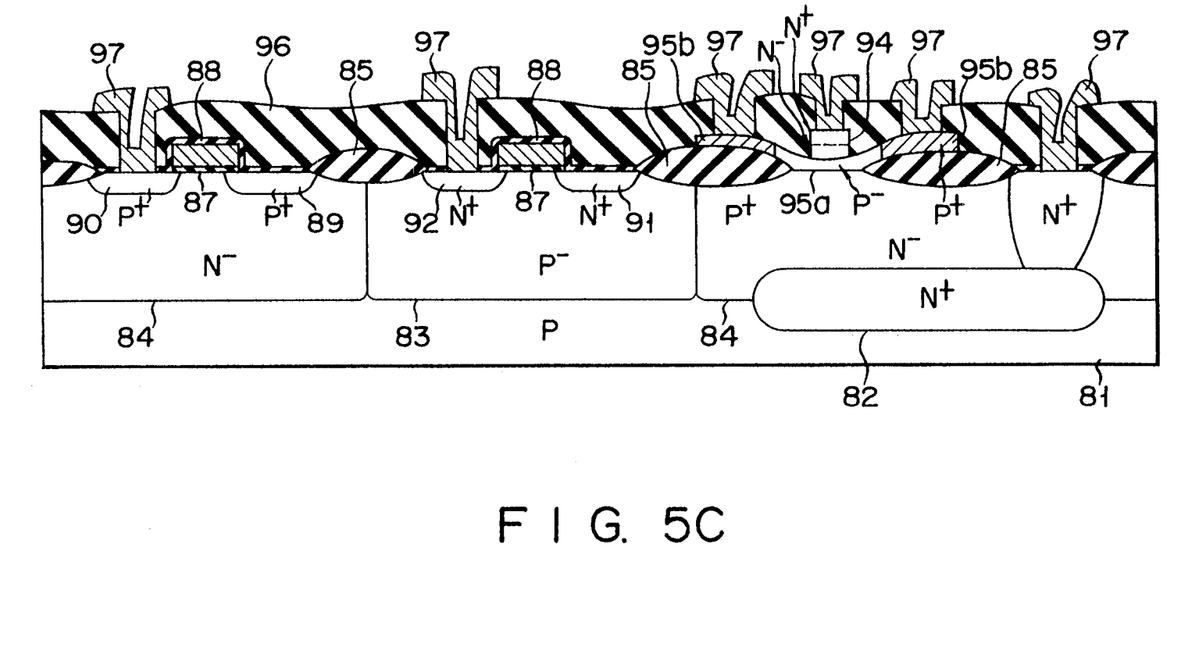

Next, as shown in FIG. 5C, a mixed crystal of silicon and germanium is formed and then a heat treatment (at 600° to 900° C.) is effected in order to crystallize the silicon. As a result, an internal base region (mixed crystal of silicon and germanium) 95a containing a P−-type impurity and an external base region 95b containing a P+-type impurity and having an impurity concentration higher than the internal base region 95a are formed in the amorphous silicon layer 93. Further, arsenic is ion-implanted into the surface area of the amorphous silicon layer 94 at a high impurity concentration to form an N+-type region. Next, the amorphous silicon layer 94 is patterned to form an emitter region. After this, an SiGe layer formed of the internal base region 95a and the external base region 95b is selectively etched to lie over the field oxide film 85 to form a base region. Next, an inter-level insulation film 96 is deposited on the entire surface by use of the CVD method, and then a heat treatment is effected at 1000° C. for approx. 10 seconds. Contact holes reaching the base region and the like are formed in the inter-level insulation film 96. After this, an Al wiring layer 97 is formed and then a passivation film (not shown) is deposited.

With the above method, the MOSFETs and the HBT, having the mixed crystal of silicon and germanium formed in the base region, can be formed on the same substrate. Therefore, it becomes possible to use the HBT in the bipolar transistor of totem-pole type BiCMOS composite gate as shown in FIG. 3. Further, the capacitance between the base and emitter of the HBT can be reduced in comparison with that of the first embodiment.

Figure 6A:
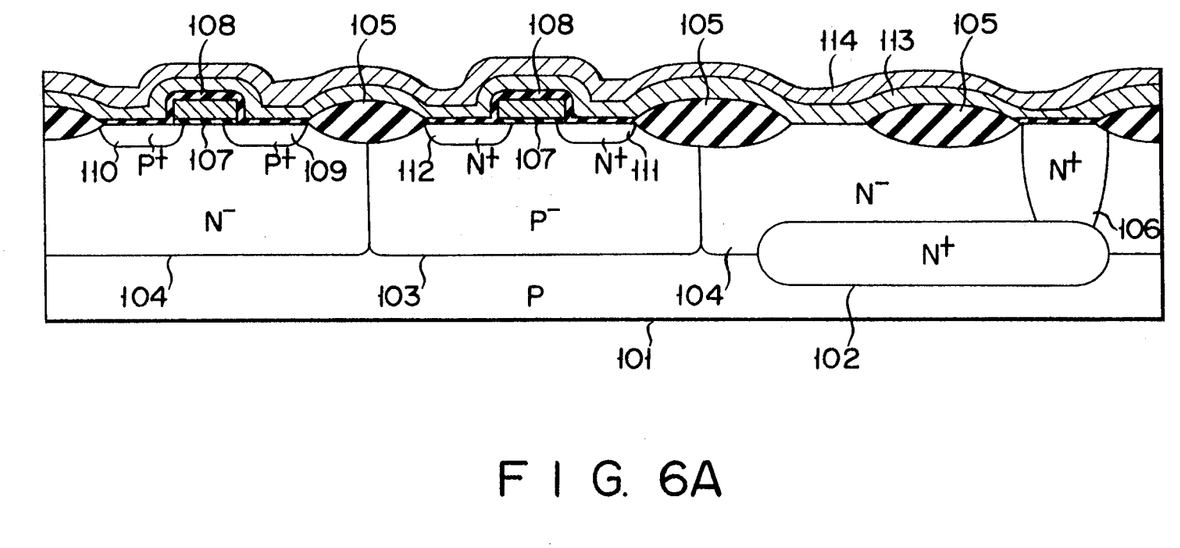
FIGS. 6A and 6B are cross sectional views showing a method of manufacturing a semiconductor device of the present invention.
Figure 6B:
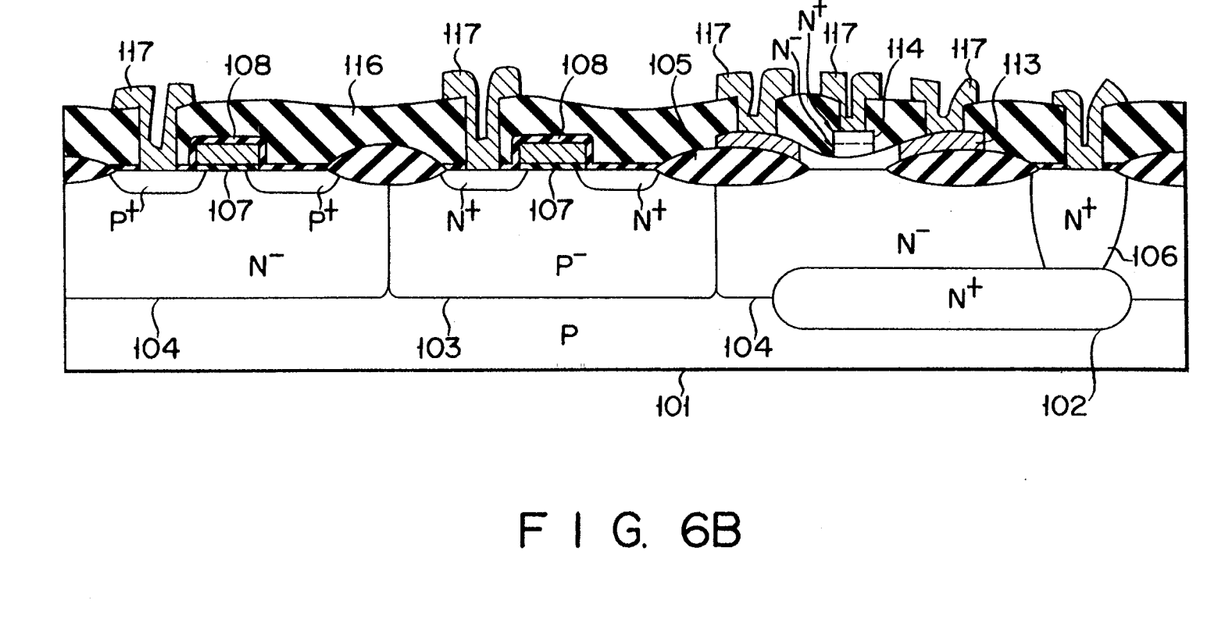

FIGS. 6A and 6B show a method of manufacturing a semiconductor device according to a third embodiment of the present invention.

First, as shown in FIG. 6A, an N+-type buried layer 102 is formed on a P-type substrate 101 and then an N-type epitaxial layer is formed on the entire surface of the structure. Further, P−-type well 103 and N−-type wells 104 are formed in the N-type epitaxial layer. A field oxide film 105 is formed in the surface area of the N-type epitaxial layer. At this time, a trench may be formed in the N-type epitaxial layer to isolate bipolar transistors. Further, in a bipolar transistor forming area, an N+-type region 106 connected to a collector electrode is formed. Next, in a MOSFET forming area, channel ions are implanted to form gate oxide films 107. Further, after a polysilicon film is deposited on the entire surface of the structure, for example, the polysilicon film is patterned to form gate electrodes 108. A heat treatment is then effected and then, in a P-channel MOSFET forming area, a P+-type impurity is ion-implanted to form a P+-type source region 109 and a P+-type drain region 110. The ion-implantation process is effected by ion-implanting boron fluoride (BF$_2$) at approx. 40 KeV by an amount of approx. 2 to $5 \times 10^{15}$ cm$^{-3}$. Next, in an N-channel MOSFET forming area, an N+-type impurity is ion-implanted to form an N+-type source region 111 and an N+-type drain region 112. In this case, the ion-implantation process is effected by ion-implanting arsenic (As) at approx. 40 keV by an amount of approx. 2 to $5 \times 10^{15}$ cm$^{-3}$. Next, a photo-lithographic process is effected to etch away the oxide film lying on the active region of the bipolar transistor. After this, an SiGe layer 113 and an amorphous silicon layer 114 are deposited on the entire surface by the CVD method. At this time, P-type and N-type impurities are respectively doped into the SiGe layer 113 and the amorphous silicon layer 114 by an amount of approx. 5 to $10 \times 10^{18}$ cm$^{-3}$. The SiGe layer 113 and the amorphous silicon layer 114 may be formed after the inter-level insulation film is formed by the CVD method.

Next, as shown in FIG. 6B, a mixed crystal of silicon and germanium is formed and then a heat treatment (at 600° to 900° C.) is effected in order to crystallize the silicon. Further, arsenic is ion-implanted into the surface area of the amorphous silicon layer 114 at a high impurity concentration to form an N+-type region. Then, the amorphous silicon layer 114 is patterned to form the emitter region. The SiGe layer 113 is also patterned to form a base region which lies over the field oxide film 105. After an inter-level insulation film 116 is formed on the entire surface by the CVD method, a heat treatment is effected at 1000° C. for approx. 10 seconds. Contact holes reaching the emitter region and the like are formed in the inter-level insulation film 116. After this, an Al wiring layer 117 is formed and then a passivation film (not shown) is deposited on the entire surface.

with the above method, the same effect as that obtained in the first and second embodiments can be attained.

The present invention can be applied to a semiconductor device having semiconductor regions of conductivity types opposite to those of the semiconductor regions of the semiconductor device explained in each of the above embodiments.

Thus, according to this invention, for example, in a totem-pole type BiCMOS inverter circuit in which bipolar transistors and MOS transistors can be formed on the same substrate, the bipolar transistor is formed of a hetero-bipolar transistor having a heterojunction. A material of a mixed crystal of silicon and germanium having a narrow band gap is used for forming the base region of the hetero-bipolar transistor. As a result, in this invention, the delay time for each stage of the totem-pole type BiCMOS composite gate is not significantly changed even if the power source voltage $V_{CC}$ is lowered to approx. 2 V, unlike the conventional case wherein the delay time becomes significantly long when the power source voltage $V_{CC}$ becomes less than 3 V.

Additional advantages and modifications will readily occur to those skilled in the art. Therefore, the invention in its broader aspects is not limited to the specific details, representative devices, and illustrated examples shown and described herein. Accordingly, various modifications may be without departing from the spirit or scope of the general inventive concept as defined by the appended claims and their equivalents.

What is claimed is:

1. A BiCMOS device comprising:
   a first P-type MOS transistor having a gate connected to an input terminal, having a source connected to a first power terminal, and having a drain;
   a first N-type MOS transistor having a gate connected to said input terminal, having a source connected to a second power terminal, and having a drain;
   a second N-type MOS transistor having a gate connected to said input terminal, having a drain connected to an output terminal, and having a source;
   a third N-type MOS transistor having a gate connected to the drains of said first P-type MOS transistor and said first N-type MOS transistor, having a source connected to said second power terminal, and having a drain connected to the source of said second N-type MOS transistor;
   a first NPN-type bipolar transistor, including a collector connected to said first power terminal, a base connected to the drains of said first P-type MOS transistor and said first N-type MOS transistor, and an emitter connected to said output terminal; and
   a second NPN-type bipolar transistor, including a collector connected to said output terminal, a base connected to the source of said second N-type MOS transistor and the drain of said third N-type MOS transistor, and an emitter connected to said second power terminal, wherein at least one of said first NPN-type bipolar transistor and said second NPN-type bipolar transistor comprises a hetero-bipolar transistor having a heterojunction, and said hetero-bipolar transistor includes:
   a semiconductor substrate of a first conductivity type;
   a semiconductor region of a second conductivity type formed on said semiconductor substrate;
   a field oxide film formed on said semiconductor region;
   a first semiconductor layer of the first conductivity type formed in contact with said semiconductor region and formed to lie over said field oxide film; and
   a second semiconductor layer of the second conductivity type formed on said first semiconductor layer.

2. A BiCMOS device comprising:
   a first P-type MOS transistor having a gate connected to an input terminal, having a source connected to a first power terminal, and having a drain;
   a first N-type MOS transistor having a gate connected to said input terminal, having a source connected to a second power terminal, and having a drain;
   a second N-type MOS transistor having a gate connected to said input terminal, having a drain connected to an output terminal, and having a source;
   a third N-type MOS transistor having a gate connected to the drains of said first P-type MOS transistor and said first N-type MOS transistor, having a source connected to said second power terminal, and having a drain connected to the source of said second N-type MOS transistor;
   a first NPN-type bipolar transistor, including a collector connected to said first power terminal, a base connected to the drains of said first P-type MOS transistor and said first N-type MOS transistor, and an emitter connected to said output terminal; and
   a second NPN-type, bipolar transistor, including a collector connected to said output terminal, a base connected to the source of said second N-type MOS transistor and the drain of said third N-type MOS transistor, and an emitter connected to said second power terminal, wherein at least one of said first NPN-type bipolar transistor and said second NPN-type bipolar transistor comprises a hetero-bipolar transistor having a heterojunction, and said hetero-bipolar transistor includes:
   a semiconductor substrate of a first conductivity type;
   a semiconductor region of a second conductivity type formed on said semiconductor substrate;
   a field oxide film formed on said semiconductor region;
   a first semiconductor layer of the first conductivity type formed in contact with said semiconductor region and formed to lie over said field oxide film; and
   a second semiconductor layer of the second conductivity type formed on said first semiconductor layer, wherein said semiconductor region is a collector region, said first semiconductor layer is a base region, said second semiconductor layer is an emitter region, and a material used for forming said base region has a band gap narrower than a material used for forming said emitter and collector regions.

3. A BiCMOS device according to claim 1, wherein said hetero-bipolar transistor is a bipolar transistor of double-hetero structure in which a material used for forming the base region thereof has a band gap narrower than a material used for forming the emitter and collector regions thereof.

4. A BiCMOS device according to claim 2, wherein at least part of the base region of said hetero-bipolar transistor is formed of a mixed crystal of silicon and germanium.

5. A semiconductor device comprising:
a semiconductor chip;
a plurality of MOS transistors formed on said semiconductor chip; and
a plurality of bipolar transistors formed on said semiconductor chip, wherein each of said bipolar transistors is formed of a hetero-bipolar transistor having a heterojunction, and wherein each of said hetero-bipolar transistors comprises:
a semiconductor substrate of a first conductivity type,
a first semiconductor region of a second conductivity type formed on said semiconductor substrate,
a field oxide film formed on said first semiconductor region,
a second semiconductor region of the first conductivity type formed in said first semiconductor region, and
a semiconductor layer of the second conductivity type formed in contact with said second semiconductor region and formed to lie over said field oxide film.

6. A semiconductor device according to claim 5, wherein said first semiconductor region is a collector region, said second semiconductor region is a base region, said semiconductor layer is an emitter region, and a material used for forming said base region has a band gap narrower than a material used for forming said emitter and collector regions.

7. A BiCMOS device comprising:
a first P-type MOS transistor having a gate connected to an input terminal, having a source connected to a first power terminal, and having a drain;
a first N-type MOS transistor having a gate connected to said input terminal, having a source connected to a second power terminal, and having a drain;
a second N-type MOS transistor having a gate connected to said input terminal, having a drain connected to an output terminal, and having a source;
a third N-type MOS transistor having a gate connected to the drains of said first P-type MOS transistor and said first N-type MOS transistor, having a source connected to said second power terminal, and having a drain connected to the source of said second N-type MOS transistor;
a first NPN-type bipolar transistor including a collector connected to said first power terminal, a base connected to the drains of said first P-type MOS transistor and said first N-type MOS transistor, and an emitter connected to said output terminal; and
a second NPN-type bipolar transistor including a collector connected to said output terminal, a base connected to the source of said second N-type MOS transistor and the drain of said third N-type MOS transistor, and an emitter connected to said second power terminal, wherein at least one of said first NPN-type bipolar transistor and said second NPN-type bipolar transistor comprises a hetero-bipolar transistor having a heterojunction, and said hetero-bipolar transistor includes:
a semiconductor substrate of a first conductivity type,
a first semiconductor region of a second conductivity type formed on said semiconductor substrate,
a field oxide film formed on said first semiconductor region,
a second semiconductor region of the first conductivity type formed in said first semiconductor region, and
a semiconductor layer of the second conductivity type formed in contact with said second semiconductor region and formed to lie over said field oxide film.

8. A BiCMOS device according to claim 7, wherein said hetero-bipolar transistor is a bipolar transistor of double-hetero structure in which a material used for forming the base region thereof has a band gap narrower than a material used for forming the emitter and collector regions thereof.

9. A BiCMOS device comprising:
a first P-type MOS transistor having a gate connected to an input terminal, having a source connected to a first power terminal, and having a drain;
a first N-type MOS transistor having a gate connected to said input terminal, having a source connected to a second power terminal, and having a drain;
a second N-type MOS transistor having a gate connected to said input terminal, having a drain connected to an output terminal, and having a source;
a third N-type MOS transistor having a gate connected to the drains of said first P-type MOS transistor and said first N-type MOS transistor, having a source connected to said second power terminal, and having a drain connected to the source of said second N-type MOS transistor;
a first NPN-type bipolar transistor including a collector connected to said first power terminal, a base connected to the drains of said first P-type MOS transistor and said first N-type MOS transistor, and an emitter connected to said output terminal; and
a second NPN-type bipolar transistor including a collector connected to said output terminal, a base connected to the source of said second N-type MOS transistor and the drain of said third N-type MOS transistor, and an emitter connected to said second power terminal, wherein at least one of said first NPN-type bipolar transistor and said second NPN-type bipolar transistor comprises a hetero-bipolar transistor having a heterojunction, and said hetero-bipolar transistor includes:
a semiconductor substrate of a first conductivity type,
a first semiconductor region of a second conductivity type formed on said semiconductor substrate,
a field oxide film formed on said first semiconductor region,
a second semiconductor region of the first conductivity type formed in said first semiconductor region, and a semiconductor layer of the second conductivity type formed in contact with said second semiconductor region and formed to lie over said field oxide film, wherein said first semiconductor region is a collector region, said second semiconductor region is a base region, said semiconductor layer is an emitter region, and a material used for forming said base region has a band gap narrower than a material used for forming said emitter and collector regions.

10. A BiCMOS device according to claim 9, wherein at least part of the base region of said hetero-bipolar transistor is formed of a mixed crystal of silicon and germanium.

11. A BiCMOS device comprising:
an emitter coupled logic (ECL) logic circuit including a plurality of bipolar transistors, each of which is a hetero-bipolar transistor having:
a semiconductor substrate of a first conductivity type,
a first semiconductor region of a second conductivity type formed on said semiconductor substrate,
a field oxide film formed on said semiconductor region,
a second semiconductor region of the first conductivity type formed in said first semiconductor region, and
a semiconductor layer of the second conductivity type formed in contact with said second semiconductor region and formed to lie over said field oxide film.

12. A BiCMOS device according to claim 11, wherein each of said hetero-bipolar transistors is a bipolar transistor of double-hetero structure in which a material used for forming the base region has a band gap narrower than a material used for forming the emitter and collector regions.

13. A BiCMOS device according to claim 11, wherein at least part of the base region of each of said hetero-bipolar transistors is formed of a mixed crystal of silicon and germanium.

14. A BiCMOS device according to claim 11, wherein said second semiconductor region is a base region, said semiconductor layer is an emitter region, and a material used for forming said base region has a band gap narrower than a material used for forming said emitter and collector regions.

* * * * *